US012777897B2

(12) United States Patent
Kim et al.

(10) Patent No.: US 12,777,897 B2
(45) Date of Patent: Oct. 27, 2026

(54) SEMICONDUCTOR PACKAGE AND PACKAGE-ON-PACKAGE HAVING THE SAME

(71) Applicant: SAMSUNG ELECTRONICS CO., LTD., Suwon-si (KR)

(72) Inventors: Jaesun Kim, Suwon-si (KR); Yunseok Choi, Suwon-si (KR); Youngbae Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 494 days.

(21) Appl. No.: 18/209,286

(22) Filed: Jun. 13, 2023

(65) Prior Publication Data

US 2024/0071845 A1 Feb. 29, 2024

(30) Foreign Application Priority Data

Aug. 31, 2022 (KR) ........................ 10-2022-0110323

(51) Int. Cl.
*H10P 70/00* (2026.01)
*H10P 74/00* (2026.01)
(Continued)

(52) U.S. Cl.
CPC ......... *H10P 74/273* (2026.01); *H10W 70/685* (2026.01); *H10W 90/00* (2026.01);
(Continued)

(58) Field of Classification Search
CPC ..... H01L 22/32; H01L 23/5386; H01L 24/04; H01L 22/34; H10P 74/273; H10P 74/277
See application file for complete search history.

(56) References Cited

U.S. PATENT DOCUMENTS 9,941,207 B2 4/2018 Lin
11,088,037 B2 8/2021 Chen et al.
(Continued)

FOREIGN PATENT DOCUMENTS

CN 113937069 A 1/2022
KR 10-2012-0134996 A 12/2012
(Continued)

OTHER PUBLICATIONS

Office Action issued on Jan. 6, 2025 by the Taiwanese Patent Office in Taiwanese Patent Application No. 112122854.
(Continued)

*Primary Examiner* — Michele Fan
(74) *Attorney, Agent, or Firm* — Sughrue Mion, PLLC

(57) ABSTRACT

A semiconductor package includes: a redistribution layer including a plurality of conductive lines; a plurality of conductive vias each connected to at least one of the plurality of conductive lines; and a plurality of lower pads each connected to one of the plurality of conductive vias; a semiconductor chip on the redistribution layer; and a plurality of external connection terminals attached to the plurality of lower pads; and a plurality of electrical paths, wherein each of the plurality of electrical paths includes at least one of the plurality of conductive lines and at least one of the plurality of conductive vias. The plurality of electrical paths is configured for testing the plurality of conductive lines and the plurality of conductive vias and is connected to at least four of the external connection test terminals.

17 Claims, 14 Drawing Sheets

(51) Int. Cl.
*H10W 70/685* (2026.01)
*H10W 90/00* (2026.01)
*H10W 74/15* (2026.01)

(52) U.S. Cl.
CPC .......... *H10W 90/701* (2026.01); *H10W 74/15* (2026.01); *H10W 90/724* (2026.01); *H10W 90/734* (2026.01)

(56) References Cited

U.S. PATENT DOCUMENTS

| | | | |
|---|---|---|---|
| 11,127,643 B1 | 9/2021 | Heyfitch et al. | |
| 11,226,363 B2 | 1/2022 | Su et al. | |
| 11,269,020 B2 | 3/2022 | Wu | |
| 11,600,523 B2 | 3/2023 | Lam | |
| 2004/0232548 A1 | 11/2004 | Maruko | |
| 2005/0248011 A1 | 11/2005 | Jung et al. | |
| 2006/0290363 A1 | 12/2006 | Botelho | |
| 2012/0305916 A1* | 12/2012 | Liu | H01L 23/5226 257/E23.151 |
| 2013/0120018 A1 | 5/2013 | Hou et al. | |
| 2014/0091471 A1* | 4/2014 | Chen | H01L 23/49838 257/770 |
| 2018/0254227 A1 | 9/2018 | Chen et al. | |
| 2021/0366863 A1 | 11/2021 | Wu et al. | |
| 2021/0407911 A1 | 12/2021 | Park et al. | |
| 2022/0271024 A1 | 8/2022 | Lu et al. | |

FOREIGN PATENT DOCUMENTS

| | | | | |
|---|---|---|---|---|
| KR | 10-2014-0043651 A | 4/2014 | | |
| KR | 10-1707931 B1 | 2/2017 | | |
| TW | 201250955 A | 12/2012 | | |
| TW | 201340799 A | 10/2013 | | |
| TW | 201828377 A | 8/2018 | | |
| TW | 201839940 A | 11/2018 | | |
| WO | WO-2023060732 A1 * | 4/2023 | H01L 23/544 | |

OTHER PUBLICATIONS

Communication dated Feb. 5, 2024, issued by the European Patent Office in European Application No. 23182823.7.

Communication issued on Jan. 26, 2026 by the Taiwan Intellectual Property Office in Taiwanese Patent Application No. 112122854.

Communication dated May 19, 2026 issued by the Korean Ministry of Intellectual Property in Korean Patent Application No. 10-2022-0110323.

* cited by examiner

SEMICONDUCTOR PACKAGE AND PACKAGE-ON-PACKAGE HAVING THE SAME

CROSS-REFERENCE TO RELATED APPLICATION

This application claims priority to Korean Patent Application No. 10-2022-0110323, filed on Aug. 31, 2022, in the Korean Intellectual Property Office, the disclosure of which is incorporated by reference herein in its entirety.

BACKGROUND

The disclosure relates to a semiconductor package and a package-on-package including the semiconductor package, and more particularly, to a fan-out semiconductor package and a package-on-package including the fan-out semiconductor package.

As the electronics industry has rapidly developed, much smaller and lighter electronic apparatuses have been developed to satisfy users' demands, and thus, semiconductor devices, which are core components of electronic apparatuses, must be highly integrated. In addition, small and multifunctional semiconductor devices are needed along with the development of mobile products.

Therefore, semiconductor packages of a package-on-package type in which semiconductor packages having different functions are disposed on one another have been developed to provide multifunctional semiconductor packages.

SUMMARY

Example embodiments provide a semiconductor package having high electrical reliability and a package-on-package including the semiconductor package.

Further, example embodiments provide a semiconductor package of which a lower redistribution layer, connection structures, and an upper redistribution layer are electrically tested together, and a package-on-package including the semiconductor package.

Further still, example embodiments relate to a semiconductor package and a package-on-package including the semiconductor package, and more particularly, to a fan-out semiconductor package and a package-on-package including the fan-out semiconductor package.

According to an aspect of an example embodiment, a semiconductor package includes: a redistribution layer including: a plurality of conductive lines; a plurality of conductive vias, each of the plurality of conductive vias being connected to at least one of the plurality of conductive lines; and a plurality of lower pads, each of the plurality of lower pads being connected to one of the plurality of conductive vias; a semiconductor chip provided on the redistribution layer; a plurality of external connection terminals attached to the plurality of lower pads; and a plurality of electrical paths configured for testing the plurality of conductive lines and the plurality of conductive vias, each of the plurality of electrical paths including at least one of the plurality of conductive lines and at least one of the plurality of conductive vias, wherein each of the plurality of electrical paths is connected to at least four external connection test terminals from among the plurality of external connection terminals.

According to an aspect of an example embodiment, a semiconductor package includes: a first redistribution layer including: a plurality of first conductive lines; a plurality of first conductive vias, each of the plurality of first conductive vias being connected to at least one of the plurality of first conductive lines; and a plurality of first lower pads, each of the plurality of first lower pads being connected to one of the plurality of first conductive vias; a semiconductor chip provided on the first redistribution layer; connection structures provided on the first redistribution layer and spaced apart from the semiconductor chip in a horizontal direction; a plurality of external connection terminals attached to the plurality of first lower pads; a second redistribution layer provided on the connection structures, the second redistribution layer including: a plurality of second conductive lines; a plurality of second conductive vias, each of the plurality of second conductive vias being connected to at least one of the plurality of second conductive lines; a plurality of second lower pads, each of the plurality of second lower pads being connected to one of the plurality of second conductive vias, a plurality of second upper pads; and a plurality of electrical paths configured for testing (i) the plurality of first lower pads, the plurality of first conductive lines, and the plurality of first conductive vias, or (ii) the plurality of second lower pads, the plurality of second conductive lines, and the plurality of second conductive vias, wherein each of the plurality of electrical paths includes at least one of the plurality of first conductive lines and at least one of the plurality of first conductive vias, wherein each of the plurality of electrical paths is connected to at least four external connection test terminals from among the plurality of external connection terminals, and wherein the at least four external connection test terminals include: at least two first test terminals configured to input a test input signal; and at least two second test terminals configured to output a test output signal.

According to an aspect of an example embodiment, a package-on-package includes: a first semiconductor package; and a second semiconductor package, wherein the first semiconductor package includes: a first redistribution layer including: a plurality of first conductive lines; a plurality of first conductive vias, each of the plurality of first conductive vias being connected to at least one of the plurality of first conductive lines; and a plurality of first lower pads, each of the plurality of first lower pads being connected to one of the plurality of first conductive vias; a first semiconductor chip provided on the first redistribution layer and including chip pads; connection structures provided on the first redistribution layer and spaced apart from the first semiconductor chip in a horizontal direction; a plurality of external connection terminals attached to the plurality of first lower pads; a second redistribution layer provided on the connection structures, the second redistribution layer including: a plurality of second conductive lines; a plurality of second conductive vias, each of the plurality of second conductive vias being connected to at least one of the plurality of second conductive lines; a plurality of second lower pads, each of the plurality of second lower pads being connected to one of the plurality of second conductive vias, and a plurality of second upper pads, wherein the second semiconductor package is provided on the first semiconductor package, wherein the second semiconductor package includes: a second semiconductor chip; and package connection terminals configured to electrically connect the second semiconductor chip to the second redistribution layer; wherein the package-on-package further includes a plurality of electrical paths configured for testing (i) the plurality of first lower pads, the plurality of first conductive lines, and the plurality of first conductive vias, or (ii) the plurality of second lower pads, the plurality of second conductive lines, and the plurality of second conductive vias, wherein each of the plurality of electrical paths includes at least one of the plurality of first conductive lines; and at least one of the plurality of first conductive vias, wherein each of the plurality of electrical paths is connected to at least four external connection test terminals from among the plurality of external connection terminals, wherein the external connection test terminals include: at least two first test terminals configured to input a test input signal; and at least two second test terminals configured to output a test output signal, wherein the external connection test terminals are provided in a plurality of first areas that are respectively adjacent to a plurality of vertices of the first redistribution layer, or are provided in a second area adjacent to a center of the first semiconductor chip, wherein the at least two first test terminals are electrically connected to each other through a lowermost conductive line of the plurality of first conductive lines, and wherein the at least two second test terminals are electrically connected to each other through a lowermost conductive line of the plurality of first conductive lines.

BRIEF DESCRIPTION OF THE DRAWINGS

The above and/or other aspects will be more clearly understood from the following detailed description of example embodiments taken in conjunction with the accompanying drawings in which.

DETAILED DESCRIPTION

Figure 1:
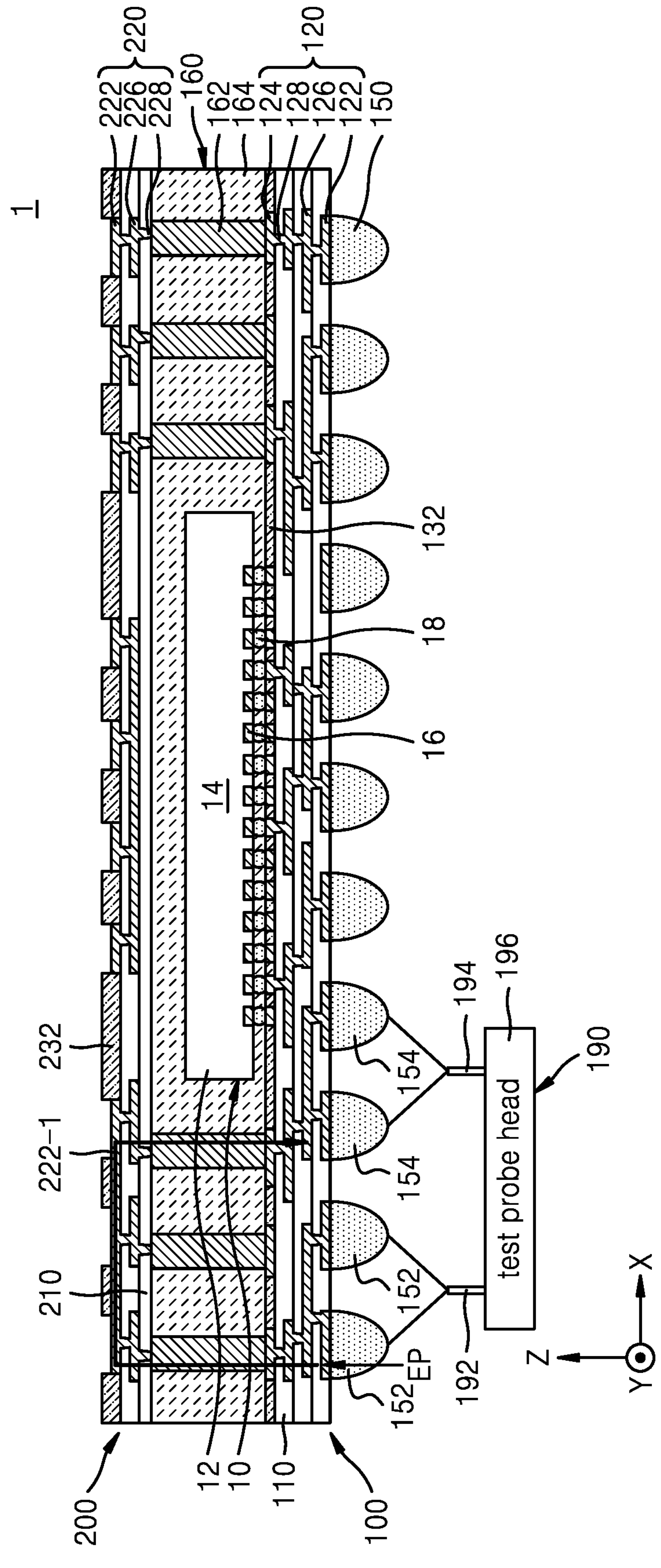
FIG. 1 is a cross-sectional view illustrating a semiconductor package according to one or more example embodiments.

Hereinafter, example embodiments will be described with reference to the accompanying drawings. In the drawings, like reference numerals refer to like elements, and repeated descriptions thereof are omitted.

FIG. 1 is a cross-sectional view illustrating a semiconductor package 1 according to one or more example embodiments. In FIG. 1, the arrow EP indicates an electrical path (test chain) in the semiconductor package 1. The electrical path may be a path along which a test signal is transmitted inside the semiconductor package 1.

Referring to FIG. 1, the semiconductor package 1 may include a semiconductor chip 10, a lower redistribution layer 100, an extended layer 160, connection structures 162, and an upper redistribution layer 200. The extended layer 160 may surround the semiconductor chip 10. The semiconductor chip 10, the extended layer 160, and the connection structures 162 are provided on the lower redistribution layer 100. In addition, the upper redistribution layer 200 is disposed on the semiconductor chip 10, the extended layer 160, and the connection structures 162. Although FIG. 1 illustrates that the semiconductor package 1 includes one semiconductor chip 10, this is a non-limiting example. In one or more example embodiments, the semiconductor package 1 may include a plurality of semiconductor chips 10.

The semiconductor package 1 may be a fan-out semiconductor package in which the horizontal width and the horizontal area of the lower redistribution layer 100 are respectively greater than the horizontal width and the horizontal area of the footprint of the semiconductor chip 10, and the horizontal width and the horizontal area of the upper redistribution layer 200 are respectively greater than the horizontal width and the horizontal area of the footprint of the semiconductor chip 10. For example, when the semiconductor package 1 includes one semiconductor chip 10, the horizontal width and the horizontal area of the lower redistribution layer 100 may be respectively greater than the horizontal width and the horizontal area of the semiconductor chip 10, and the horizontal width and the horizontal area of the upper redistribution layer 200 may be respectively greater than the horizontal width and the horizontal area of the semiconductor chip 10. In one or more example embodiments, the horizontal width and the horizontal area of the lower redistribution layer 100 may be respectively equal to the horizontal width and the horizontal area of the upper redistribution layer 200. In one or more example embodiments, corresponding lateral surfaces of the lower redistribution layer 100, the extended layer 160, and the upper redistribution layer 200 may be coplanar with one another.

The semiconductor chip 10 may include: a semiconductor substrate 12 having a semiconductor device 14 formed on an active surface of the semiconductor substrate 12; and a plurality of chip pads 16 provided on the active surface of the semiconductor substrate 12. In one or more example embodiments, when the semiconductor package 1 is a lower package of a package-on-package (PoP), the semiconductor package 1 may be referred to as a first semiconductor package and/or a lower semiconductor package, the semiconductor chip 10 may be referred to as a first semiconductor chip and/or a lower semiconductor chip, the semiconductor substrate 12 may be referred to as a first semiconductor substrate and/or a lower semiconductor substrate, the semiconductor device 14 may be referred to as a first semiconductor device and/or a lower semiconductor device, and the chip pads 16 may be referred to as first chip pads and/or lower chip pads.

The semiconductor substrate 12 may include, but is not limited to, for example, a semiconductor material such as silicon (Si). Alternatively, the semiconductor substrate 12 may include, but is not limited to, a semiconductor element such as germanium (Ge), or may include, but is not limited to, a compound semiconductor such as silicon carbide (SiC), gallium arsenide (GaAs), indium arsenide (InAs), or indium phosphide (InP). The semiconductor substrate 12 may include a conductive region such as a well that is doped with a dopant. The semiconductor substrate 12 may have various device isolation structures such as a shallow trench isolation (STI) structure.

The semiconductor device 14 including a plurality of individual devices of various types may be formed on the active surface of the semiconductor substrate 12. The individual devices may include, but is not limited to, various microelectronic devices: for example, a metal-oxide-semiconductor field effect transistor (MOSFET) such as a complementary metal-insulator-semiconductor (CMOS) transistor; a system large-scale-integration (LSI) device; an image sensor such as a CMOS imaging sensor (CIS); a micro-electro-mechanical system (MEMS); an active device; a passive device; or the like. The individual devices may be electrically connected to the conductive region of the semiconductor substrate 12. The semiconductor device 14 may include at least two of the individual devices, or may further include conductive wires or conductive plugs that electrically connect the individual devices to the conductive region of the semiconductor substrate 12. In addition, each of the individual devices may be electrically isolated from adjacent individual devices by an insulating layer.

The semiconductor chip 10 may be, for example, a central processing unit (CPU) chip, a graphics processing unit (GPU) chip, or an application processor (AP) chip. In one or more example embodiments, when the semiconductor package 1 includes a plurality of semiconductor chips 10, some of the semiconductor chips 10 may be, but are not limited to, for example, dynamic random access memory (DRAM) chips, static random access memory (SRAM) chips, flash memory chips, electrically erasable and programmable read-only memory (EEPROM) chips, phase-change random access memory (PRAM) chips, magnetic random access memory (MRAM) chips, or resistive random access memory (RRAM) chips.

The semiconductor chip 10 may be mounted on the lower redistribution layer 100 by a flip-chip method. That is, the semiconductor chip 10 may be mounted on the lower redistribution layer 100 such that the active surface of the semiconductor substrate 12 may face the lower redistribution layer 100.

The chip pads 16 of the semiconductor chip 10 electrically connected to the semiconductor device 14 may be electrically connected to the lower redistribution layer 100. A plurality of chip connection terminals 18 may be provided between the chip pads 16 and some of a plurality of first upper pads 124 to electrically connect the semiconductor chip 10 to a plurality of first redistribution patterns 120. For example, the chip connection terminals 18 may be, but are not limited to, solder balls or bumps.

The lower redistribution layer 100 may also be referred to as a lower wiring structure, a first wiring structure, and/or a first redistribution layer. The upper redistribution layer 200 may be referred to as an upper wiring structure, a second wiring structure, and/or a second redistribution layer.

The lower redistribution layer 100 may be disposed under the semiconductor chip 10, the extended layer 160, and the connection structures 162, and the lower redistribution layer 100 may redistribute the chip pads 16 of the semiconductor chip 10 to an external region. For example, the lower redistribution layer 100 may include a first redistribution insulating layer 110 and the first redistribution patterns 120.

The first redistribution insulating layer 110 may include an insulating material such as a photo-imageable dielectric (PID) resin and may further include photosensitive polyimide and/or an inorganic filler. The first redistribution insulating layer 110 may have a multilayer structure according to a multilayer structure of the first redistribution patterns 120. However, for ease of illustration, FIG. 1A illustrates one or more example embodiments wherein the first redistribution insulating layer 110 has a three-layer structure. When the first redistribution insulating layer 110 has a multi-layer structure, the first redistribution insulating layer 110 may include a single material or different materials.

The first redistribution patterns 120 may transmit electrical signals and/or transfer heat in the semiconductor package 1. The first redistribution patterns 120 may include a plurality of first lower pads 122, the first upper pads 124, a plurality of first redistribution line patterns 126, and a plurality of first conductive vias 128. For example, the first redistribution patterns 120 may include, but are not limited to, a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof. However, the first redistribution patterns 120 are not limited to the one or more example embodiments described above.

The first lower pads 122 may be provided in a lower portion of the lower redistribution layer 100 and may electrically connect the lower redistribution layer 100 to the external connection terminals 150. Lower surfaces of the first lower pads 122 may be in direct contact with the external connection terminals 150, and upper surfaces of the first lower pads 122 may be in direct contact with lower surfaces of the first conductive vias 128.

According to one or more example embodiments, a lower surface of an element may refer to a surface of the element closest to one of the external connection terminals 150 in a vertical direction (Z direction), and an upper surface of the element may refer to a surface of the element that is opposite the lower surface of the element.

The first upper pads 124 may be provided in an upper portion of the lower redistribution layer 100 and may electrically connect the lower redistribution layer 100 to the semiconductor chip 10 and/or the connection structures 162. Lower surfaces of the first upper pads 124 may be in direct contact with upper surfaces of some of the first conductive vias 128, and upper surfaces of the first upper pads 124 may respectively be in direct contact with lower surfaces of the chip pads 16 and/or lower surfaces of the connection structures 162.

A photosensitive insulating material may be subjected to an exposure process and a developing process to form the first redistribution line patterns 126 and the first conductive vias 128. In one or more example embodiments, the first redistribution patterns 120 may be formed by depositing a metal or a metal alloy on a seed layer including titanium, titanium nitride, and/or titanium tungsten.

The first redistribution line patterns 126 may be provided on at least one of an upper surface and a lower surface of the first redistribution insulating layer 110. The first conductive vias 128 may penetrate at least one first redistribution insulating layer 110 and may respectively be in contact with some of the first redistribution line patterns 126. In one or more example embodiments, at least some of the first redistribution line patterns 126 may respectively be formed in one piece with some of the first conductive vias 128. For example, a first redistribution line pattern 126 may be formed in one piece with a first conductive vias 128, which is in contact with an upper surface of the first redistribution line pattern 126.

The first redistribution patterns 120, which include the first redistribution line patterns 126 and the first conductive vias 128, may be formed by a plating method. For example, the first redistribution patterns 120 may be formed by a plating method such as immersion plating, electroless plating, or electroplating.

The first conductive vias 128 may transmit electrical signals and/or transfer heat in the semiconductor package 1. The first conductive vias 128 may include, but are not limited to, a metal such as molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof. However, the first conductive vias 128 are not limited the one or more example embodiments described above. A photosensitive insulating material may be subjected to an exposure process and a developing process to form the first conductive vias 128.

In one or more example embodiments, the first conductive vias 128 may have a tapered shape extending with a horizontal width which decreases in a downward direction. That is, the horizontal width of each the first conductive vias 128 may decrease in a vertical direction (negative Z direction) away from the semiconductor chip 10.

External connection pads may be formed on the lower surfaces of the first lower pads 122, and the external connection terminals 150 may be provided on the external connection pads. The external connection terminals 150 may be electrically connected to the semiconductor chip 10 through the first redistribution patterns 120 of the lower redistribution layer 100. The external connection terminals 150 may connect the semiconductor package 1 to a main board of an electronic device on which the semiconductor package 1 is mounted. The external connection terminals 150 may be solder balls, which include a conductive material such as a metallic material including, but is not limited to, at least one selected from tin (Sn), silver (Ag), copper (Cu), and aluminum (Al).

The external connection terminals 150 may include: first external connection terminals 152 through which a test input signal may be applied, and second external connection terminals 154 through which a test output signal may be output. The first external connection terminals 152 and the second external connection terminals 154 may be collectively referred to as test terminals. When the semiconductor package 1 is later connected to a system board, for example, a ground signal may be applied to the test terminals or may not be electrically connected to any external connection terminals 150 other than the test terminals. That is, the test terminals may be dummy external connection terminals. The first external connection terminals 152 may be first test terminals, and the second external connection terminals 154 may be second test terminals.

One electrical path may include two or more first external connection terminals 152 and two or more second external connection terminals 154. A plurality of first external connection terminals 152 and a plurality of second external connection terminals 154, which are included in one electrical path, may be provided adjacent to each other.

Each of the plurality of first external connection terminals 152 may be connected to only one of an amperemeter and a voltmeter. In addition, each of the plurality of second external connection terminals 154 may be connected to only one of the amperemeter and the voltmeter. The plurality of first external connection terminals 152 to which the test input signals are applied may be electrically connected to each other at lowermost first redistribution line patterns 126. In addition, test output signals output through the plurality of second external connection terminals 154 may be electrically diverged from each other at the lowermost first redistribution line patterns 126.

As shown in FIG. 1, the external connection terminals 150 may be provided on a portion corresponding to a lower surface of the semiconductor chip 10 and a portion extending outward from the lower surface of the semiconductor chip 10 in a first horizontal direction (X direction) and a second horizontal direction (Y direction). As a result, the lower redistribution layer 100 may have a function of redistributing the external connection pads to a portion wider than the lower surface of the semiconductor chip 10.

The lower redistribution layer 100 may further include a first upper solder resist layer 132 disposed on an upper surface of the lower redistribution layer 100. The first upper solder resist layer 132 may cover an upper surface of the at least one first redistribution insulating layer 110 and may expose the first upper pads 124. In one or more example embodiments, the first upper solder resist layer 132 may be formed by applying a solder mask insulation ink to upper and lower surfaces of the at least one first redistribution insulation layer 110 by a screen printing method or an inkjet printing method, and then curing the solder mask insulating ink with heat, ultraviolet (UV) light, or infrared (IR) light. In one or more other example embodiments, the first upper solder resist layer 132 is formed by operations comprising: completely applying a photosensitive solder resist to the upper surface of the at least one first redistribution insulating layer 110 by a screen printing method or a spray coating method, or bonding a film-type solder resist material by a laminating method; removing unnecessary portions through exposure and developing processes; and then curing the photosensitive solder resist or the film-type solder resist material with heat, UV or IR.

The extended layer 160 may include: the connection structures 162; and a filler member 164 surrounding the connection structures 162 and the semiconductor chip 10. The connection structures 162 may be apart from the semiconductor chip 10 in any horizontal direction (e.g., X direction and/or Y direction) and may be provided around the semiconductor chip 10. The connection structures 162 may penetrate the filler member 164 to electrically connect the lower redistribution layer 100 to the upper redistribution layer 200. Upper and lower ends of each of the connection structures 162 may respectively be connected to, and in contact with, one of a plurality of second conductive vias 228 of the upper redistribution layer 200 and one of the first upper pads 124 of the lower redistribution layer 100.

Each of the connection structures 162 may include a through-mold via (TMV), a conductive solder, a conductive pillar, or at least one conductive bump. In one or more example embodiments, each of the connection structures 162 may be formed by soldering, to each other, a lower portion attached to one of the first upper pads 124 of the lower redistribution layer 100 and an upper portion attached to one of the second conductive vias 228 of the upper redistribution layer 200 such that the lower portion and the upper portion may reflow by heat and form one body. The filler member 164 may include, but is not limited to, for example, an epoxy mold compound (EMC).

The upper redistribution layer 200 may include a second redistribution insulating layer 210 and second redistribution patterns 220. In addition, each of the second redistribution patterns 220 may include one of the second upper pads 222, one of the second redistribution line patterns 226, and one of the second conductive vias 228. The second redistribution insulating layer 210, the second redistribution line patterns 226, and the second conductive vias 228 are respectively similar to the first redistribution insulating layer 110, the first redistribution line patterns 126, and the first conductive vias 128, and thus repetitive descriptions thereof are omitted.

The second upper pads 222 may include a first connection pad 222-1 connected to the connection structures 162. The first connection pad 222-1 may be formed by connecting a plurality of second upper pads 222 to each other. Although FIG. 1 illustrates one or more example embodiments wherein the first connection pad 222-1 extends in the first horizontal direction (X direction), the first connection pad 222-1 may extend in any horizontal direction (e.g., X direction and/or Y direction).

The upper redistribution layer 200 may further include a second upper solder resist layer 232 disposed on an upper surface of the upper redistribution layer 200. The second upper solder resist layer 232 may be substantially similar to the first upper solder resist layer 132.

A test unit 190 may test electrical characteristics of the lower redistribution layer 100, the connection structures 162, and the upper redistribution layer 200. The test unit 190 may include a first tip 192, a second tip 194 and a test probe head 196. The first tip 192 may be electrically connected to the first external connection terminals 152 to apply a test input signal of the test unit 190 to the first external connection terminals 152. The second tip 194 may be electrically connected to the second external connection terminals 154 to transmit a test output signal to the test unit 190. The test probe head 196 may apply the test input signal to the first tip 192. The test probe head 196 may receive the test output signal from the second tip 194.

The test unit 190 may perform a test process to measure electrical parameters of an electrical path. For example, the test unit 190 may include an ampere meter and/or a voltmeter. The electrical path may include, but is not limited to, the first external connection terminals 152, the first redistribution patterns 120, the connection structures 162, and the second redistribution patterns 220. The electrical path may include, but is not limited to, the first external connection terminals 152, the first redistribution line patterns 126, the first conductive vias 128, the connection structures 162, the second upper pads 222, the second redistribution line patterns 226, the second conductive vias 228, and the second external connection terminals 154. The test unit 190 may measure electrical parameters of each of the lower redistribution layer 100, the connection structures 162, and the upper redistribution layer 200.

One first external connection terminal and one second external connection terminal may be provided in one electrical path, and thus electrical parameter test sensitivity is relatively low. In addition, semiconductor packages may not provide an electrical path for testing a lower redistribution layer, connection structures, and an upper redistribution layer all together.

However, in the semiconductor package 1 of one or more example embodiments, a plurality of first external connection terminals 152 and a plurality of second external connection terminals 154 are provided in one electrical path, and thus electrical parameter test sensitivity may be higher. In addition, the semiconductor package 1 of one or more example embodiments may include the first connection pad 222-1, and thus an electrical path for testing all of the lower redistribution layer 100, the connection structures 162, and the upper redistribution layer 200 may be provided.

Figure 2A:
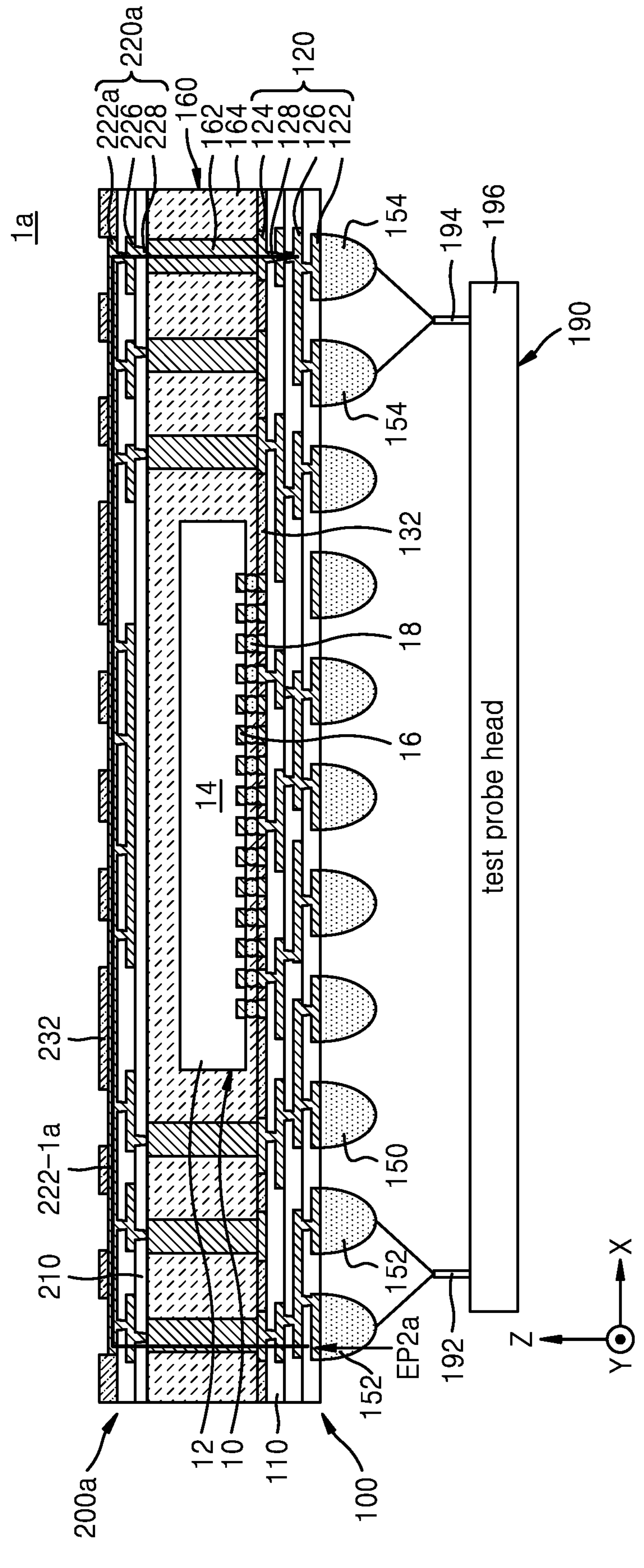
FIGS. 2A and 2B are cross-sectional views illustrating semiconductor packages according to one or more example embodiments.
Figure 2B:
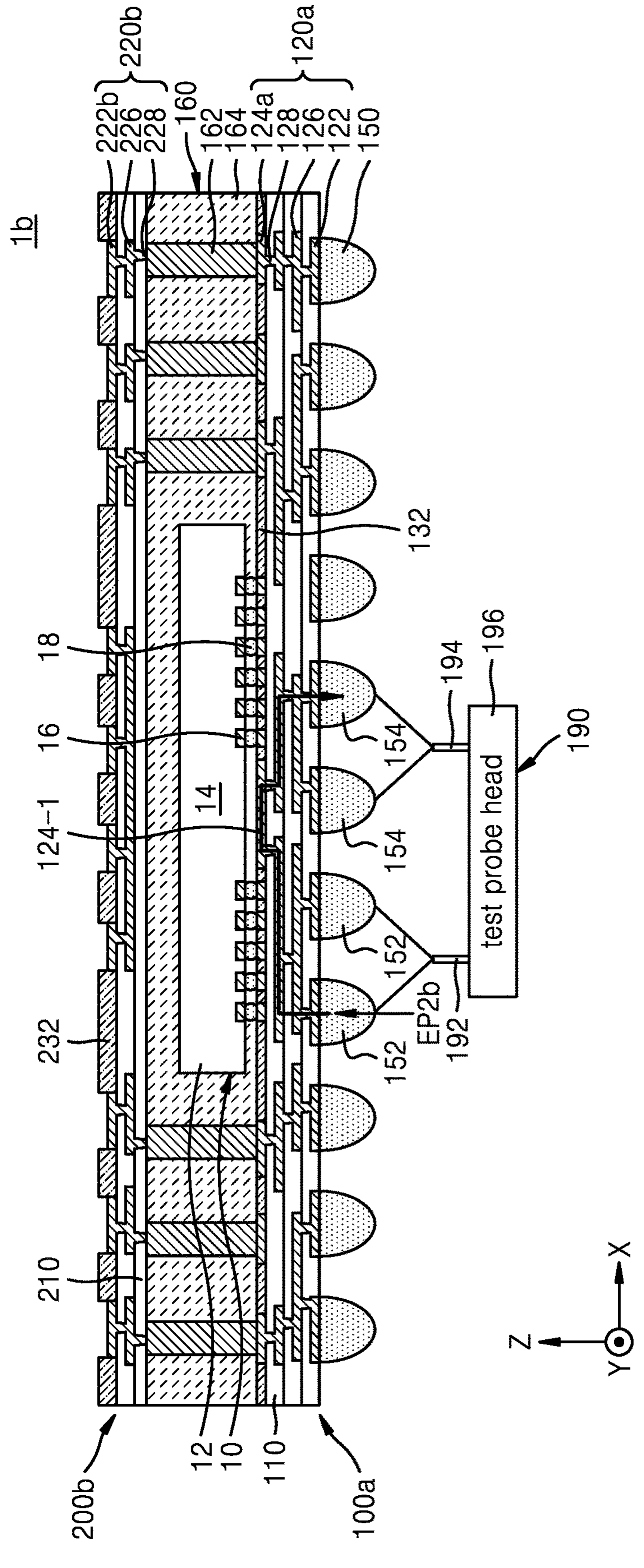

FIGS. 2A and 2B are cross-sectional views illustrating semiconductor packages 1*a* and 1*b* according to one or more example embodiments. In FIGS. 2A and 2B, arrows EP2*a* and EP2*b* refer to electrical paths inside the semiconductor packages 1*a* and 1*b*, respectively.

The semiconductor package 1*a* in FIG. 2A may include a lower redistribution layer 100, an extended layer 160, connection structures 162, and an upper redistribution layer 200*a*. The lower redistribution layer 100, the extended layer 160, and the connection structures 162 of the semiconductor package 1*a* shown in FIG. 2A are substantially similar to the lower redistribution layer 100, the extended layer 160, and the connection structures 162 of the semiconductor package 1 shown in FIG. 1, and thus the upper redistribution layer 200*a* are described below.

Referring to one or more example embodiments shown in FIG. 2A, the upper redistribution layer 200*a* includes second upper pads 222*a*, second redistribution line patterns 226, and second conductive vias 228. The second upper pads 222*a* may include a first connection pad 222-1*a*. Although FIG. 2A illustrates one or more example embodiments wherein the first connection pad 222-1*a* extends in a first horizontal direction (X direction), the first connection pad 222-1*a* may extend in any horizontal direction (e.g., X direction and/or Y direction).

A plurality of first external connection terminals 152 and a plurality of second external connection terminals 154 may be provided far from each other in an extending direction of the first connection pad 222-1*a*. That is, in a plan view, test terminals may be provided apart from each other in any of the horizontal directions (e.g., X direction and/or Y direction) on opposite sides of the semiconductor package 1*a*.

The semiconductor package 1*b* according to one or more example embodiments as shown in FIG. 2B may include a lower redistribution layer 100*a*, an extended layer 160, connection structures 162, and an upper redistribution layer 200*b*. The extended layer 160 and the connection structures 162 of the semiconductor package 1*b* shown in FIG. 2B are substantially similar to the extended layer 160 and the connection structures 162 of the semiconductor package 1 according to one or more example embodiments as shown in FIG. 1, and thus the lower redistribution layer 100*a* and the upper redistribution layer 200*b* are described below.

Referring to one or more example embodiments as shown in FIG. 2B, the lower redistribution layer 100*a* may include a first redistribution insulating layer 110, first lower pads 122, first upper pads 124*a*, first redistribution line patterns 126, and first conductive vias 128. The first upper pads 124*a* may include a second connection pad 124-1 in which some of the first upper pads 124*a* are physically and electrically connected to each other. The second connection pad 124-1 may be disposed at the same vertical level as others of the first upper pads 124*a*. Although FIG. 2B illustrates one or more example embodiments wherein the second connection pad 124-1 extends in a first horizontal direction (X direction), the second connection pad 124-1 may extend in any horizontal direction (e.g., X direction and/or Y direction).

The second connection pad 124-1 may not be electrically connected to a semiconductor chip 10. That is, the second connection pad 124-1 may not be electrically connected to chip pads 16 of the semiconductor chip 10.

A test unit 190 may perform a test process to measure electrical parameters of an electrical path. The electrical path may include the first external connection terminals 152, the first lower pads 122, the first redistribution line patterns 126, the first conductive vias 128, and the second connection pad 124-1. The test unit 190 may measure electrical parameters of the lower redistribution layer 100*a*.

The first external connection terminals 152 and the second external connection terminals 154 may be provided adjacent to each other. In addition, second upper pads 222*b* of the upper redistribution layer 200*b* may not include a first connection pad (refer to the first connection pad 122-1 according to one or more example embodiments shown in FIG. 1) forming an electrical path.

Figure 3A:
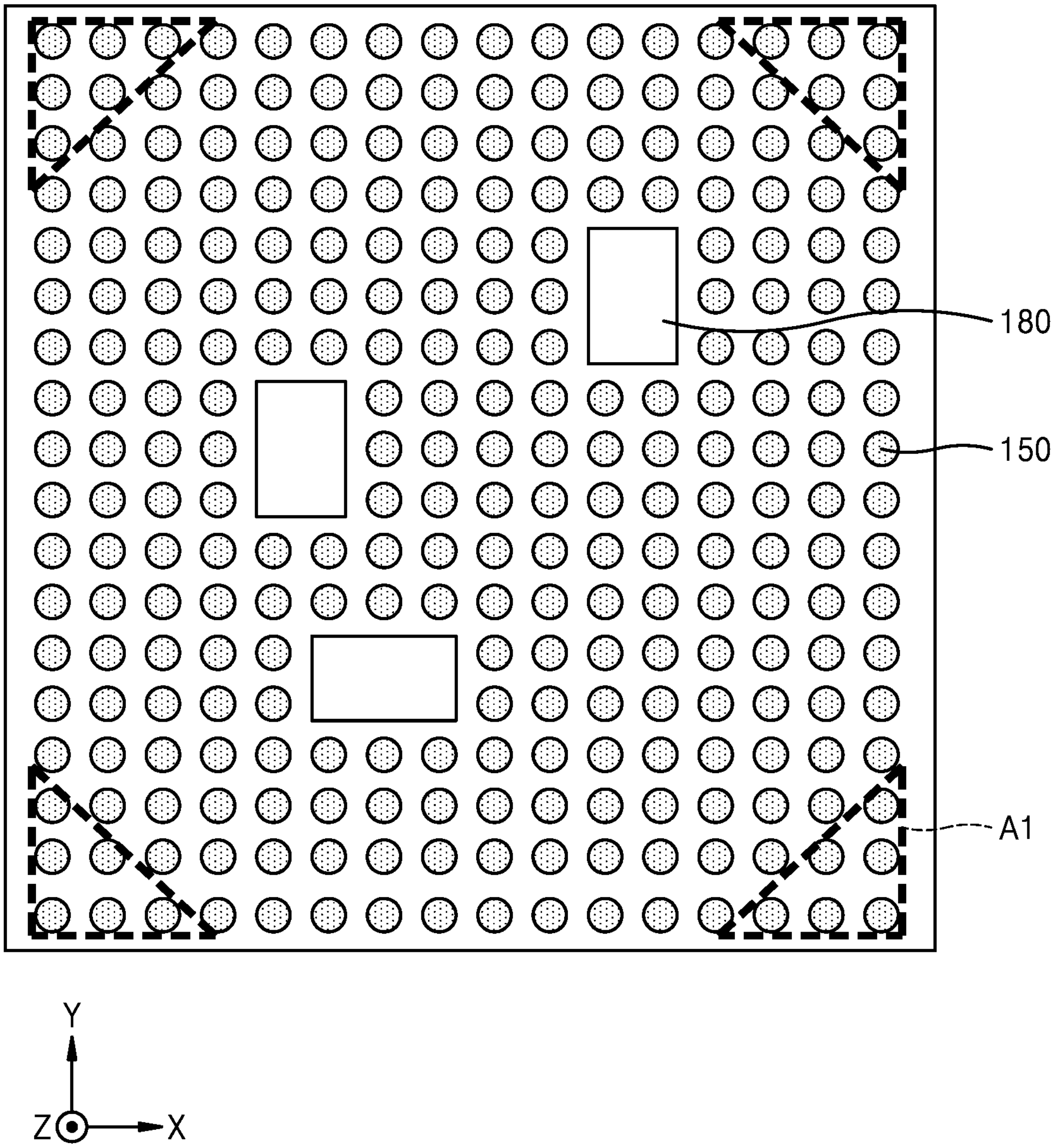
FIGS. 3A, 3B and 3C are layout views illustrating arrangements of external connection terminals according to one or more example embodiments.
Figure 3B:
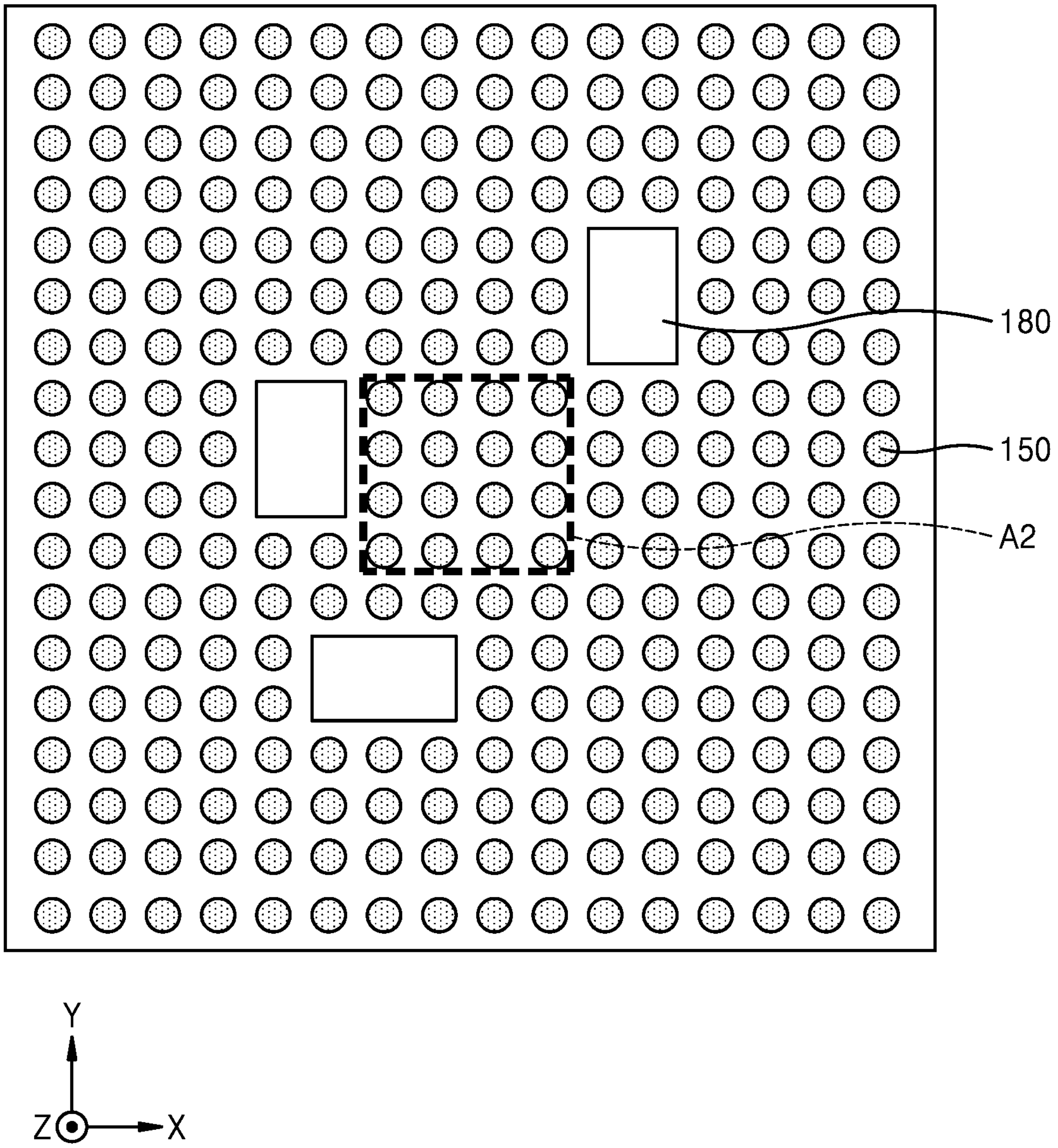
Figure 3C:
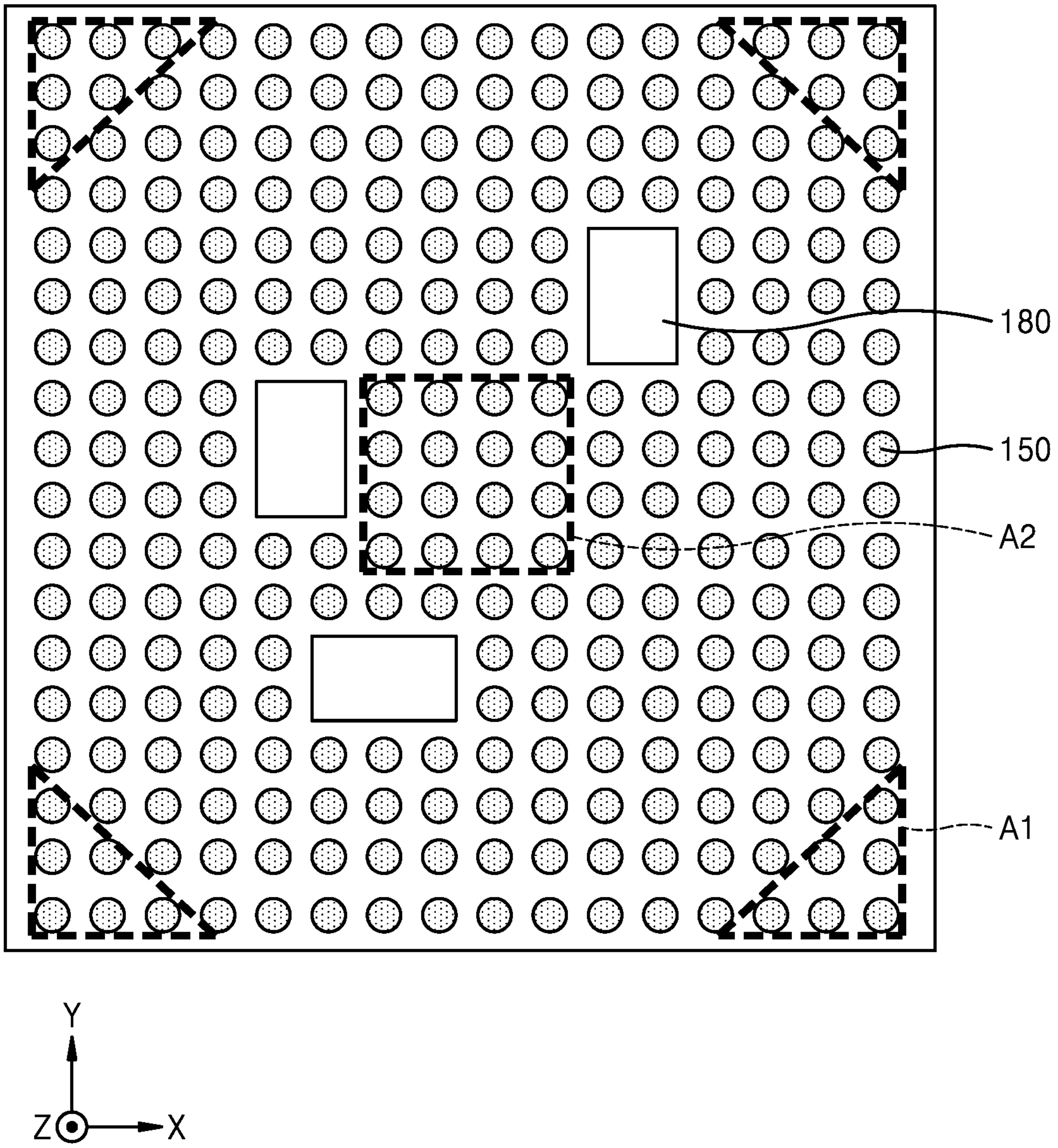

FIGS. 3A, 3B and 3C are layout views illustrating arrangements of external connection terminals according to one or more example embodiments.

Referring to FIGS. 1, 2A, 2B, 3A and 3C, a plurality of external connection terminals 150 and a plurality of passive devices 180 may be disposed on a lower surface of the lower redistribution layer 100. The passive devices 180 may include high voltage and/or low voltage transistors, resistors and/or capacitors.

According to one or more example embodiments as shown in FIG. 3A, the lower redistribution layer 100 may include a plurality of first areas A1 adjacent to the vertices of the lower redistribution layer 100 and, according to one or more example embodiments shown in FIG. 3B, a second area A2 adjacent to the center of the lower redistribution layer 100. According to one or more example embodiments, the second area A2 may be an area adjacent to the center of a semiconductor chip 10.

A plurality of first external connection terminals 152 and a plurality of second external connection terminals 154, which are included in one electrical path, may be provided in any one of the first areas A1. When a plurality of first external connection terminals 152 and a plurality of second external connection terminals 154 are provided in the first areas A1, electrical parameters of the lower redistribution layer 100, the connection structures 162, and the upper redistribution layer 200 may be measured. When a plurality of first external connection terminals 152 and a plurality of second external connection terminals 154, which are included in one electrical path, are provided in the same first area A1, electrical parameters of the lower redistribution layer 100, the connection structures 162, and the upper redistribution layer 200 of the semiconductor package 1 according to one or more example embodiments as shown in FIG. 1 may be measured.

In one or more example embodiments, a plurality of first external connection terminals 152 and a plurality of second external connection terminals 154, which are included in one electrical path, may be provided in different first areas A1. When a plurality of first external connection terminals 152 and a plurality of second external connection terminals 154, which are included in one electrical path, are provided in different first areas A1, electrical parameters of the lower redistribution layer 100, the connection structures 162, and the upper redistribution layer 200*a* of the semiconductor package 1*a* according to one or more example embodiments as shown in FIG. 2A may be measured.

In one or more example embodiments, a plurality of first external connection terminals 152 and a plurality of second external connection terminals 154, which are included in one electrical path, may be provided in the second area A2. When a plurality of first external connection terminals 152 and a plurality of second external connection terminals 154 are provided in the second area A2, electrical parameters of the lower redistribution layer 100*a* shown according to one or more example embodiments as in FIG. 2B may be measured.

Figure 4:
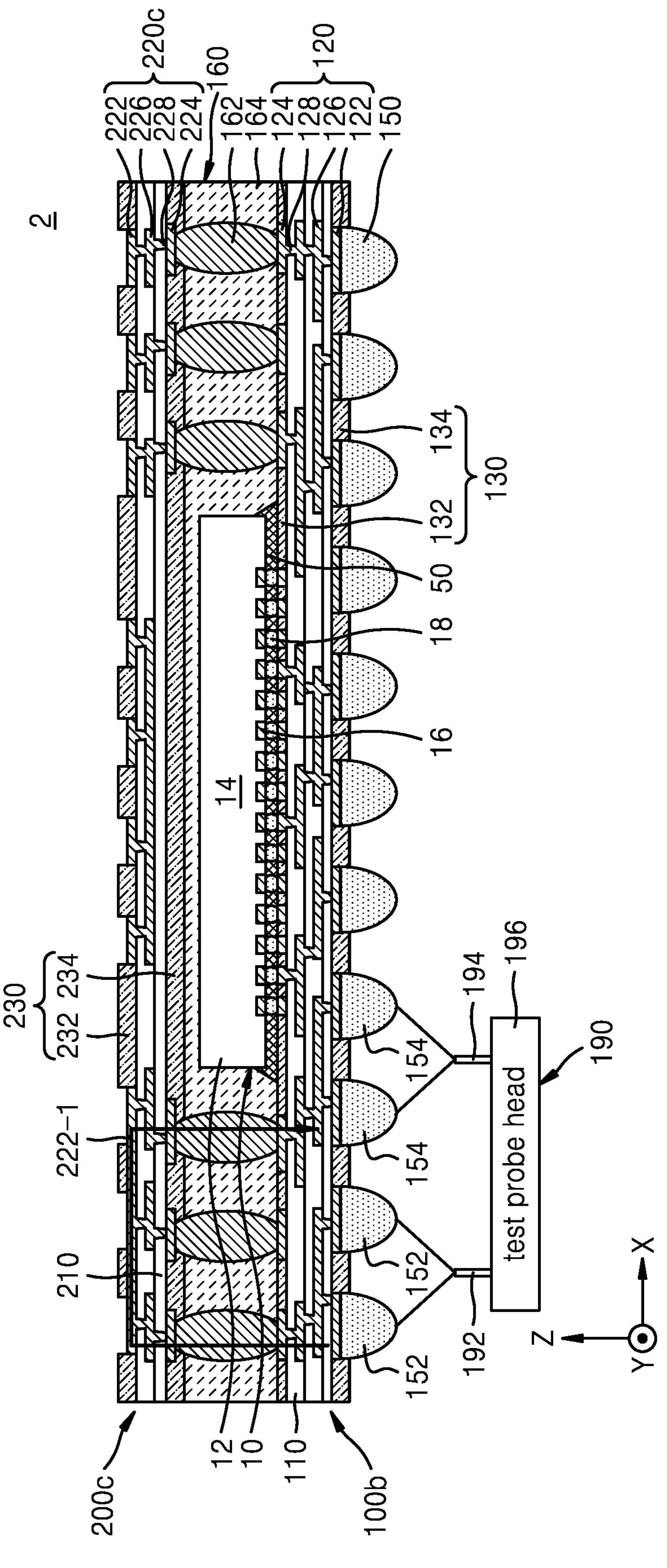
FIG. 4 is a cross-sectional view illustrating a semiconductor package according to one or more example embodiments.

FIG. 4 is a cross-sectional view illustrating a semiconductor package 2 according to one or more example embodiments.

Referring to FIG. 4, the semiconductor package 2 may include a lower redistribution layer 100*b*, connection structures 162, and an upper redistribution layer 200*c*.

The semiconductor package 2 may include a first upper solder resist layer 132 and a first lower solder resist layer 134, which are respectively provided on an upper surface and a lower surface of the lower redistribution layer 100*b*. In addition, the semiconductor package 2 may include a second upper solder resist layer 232 and a second lower solder resist layer 234, which are respectively provided on an upper surface and a lower surface of the upper redistribution layer 200*c*.

The first upper solder resist layer 132 may surround and protect first upper pads 124, and the first lower solder resist layer 134 may surround and protect first lower pads 122. The first upper solder resist layer 132 and the first lower solder resist layer 134 may form first solder resist layers 130.

The second upper solder resist layer 232 may surround and protect second upper pads 222, and the second lower solder resist layer 234 may surround and protect second lower pads 224. The second upper solder resist layer 232 and the second lower solder resist layer 234 may form second solder resist layers 230.

In addition, an underfill layer 50 may be disposed between a semiconductor chip 10 and the lower redistribution layer 100 to surround chip connection terminals 18. The underfill layer 50 may include, but is not limited to, for example, an epoxy resin and may be formed by a capillary underfill method. In one or more example embodiments, the underfill layer 50 may cover at least a portion of a lateral surface of the semiconductor chip 10.

For example, each of the connection structures 162 may include conductive solder. In addition, the upper redistribution layer 200*c* may include the second upper pads 222, the second lower pads 224, the second redistribution line patterns 226, and the second conductive vias 228.

Upper surfaces of the second lower pads 224 may be in contact with lower surfaces of some of the second conductive vias 228, and lower surfaces of the second lower pads 224 may be in contact with upper surfaces of some of the connection structures 162.

Figure 5:
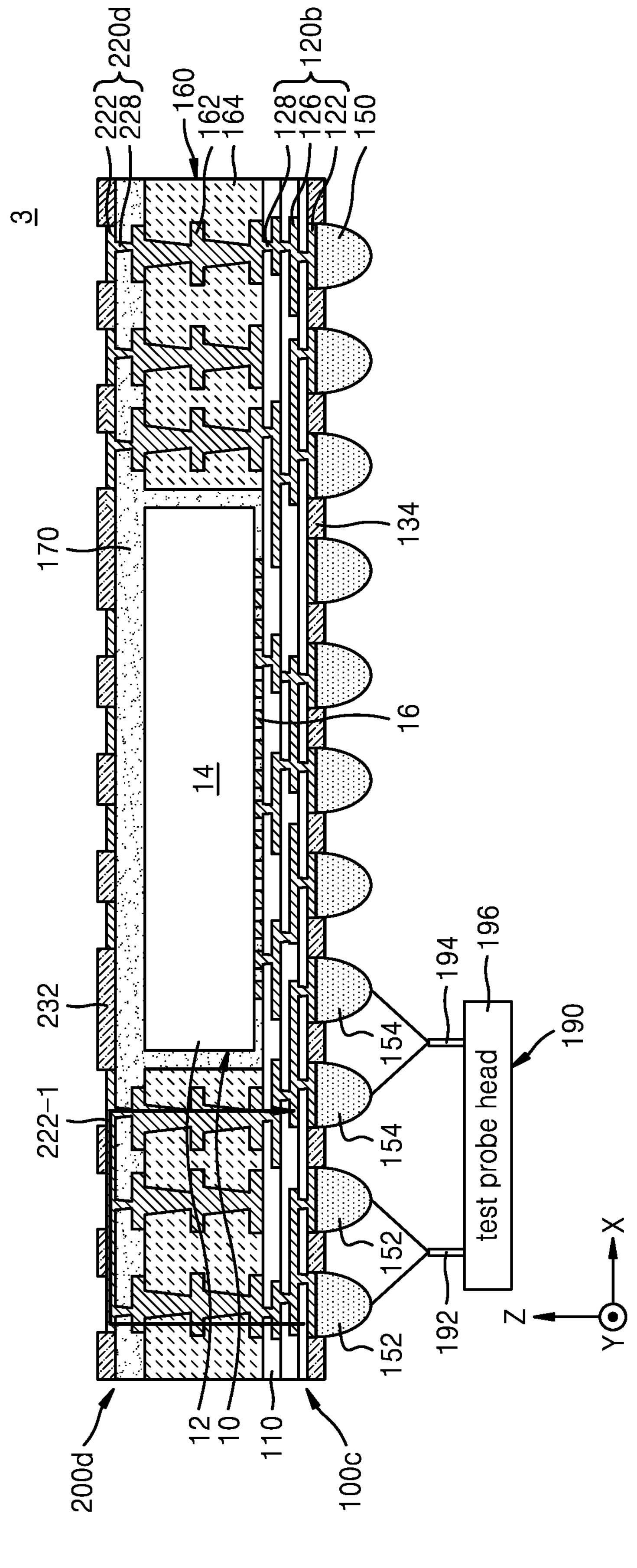
FIG. 5 is a cross-sectional view illustrating a semiconductor package according to one or more example embodiments.

FIG. 5 is a cross-sectional view illustrating a semiconductor package 3 according to one or more example embodiments.

Referring to FIG. 5, the semiconductor package 3 may include a lower redistribution layer 100*c*, connection structures 162, and an upper redistribution layer 200*d*.

The lower redistribution layer 100*c* may include a plurality of first lower pads 122, a plurality of first redistribution line patterns 126, and a plurality of first conductive vias 128.

For example, each of the connection structures 162 may be copper foil of an embedded trace substrate (ETS). Although FIG. 5 illustrates one or more example embodiments in which each of the connection structures 162 has three layers, one or more example embodiments are not limited thereto. According to one or more example embodiments, an ETS having one, two, or four or more layers may be used.

When copper foil of an ETS is selected as the connection structures 162, the semiconductor package 3 may additionally include a molding layer 170. The upper redistribution layer 200*d* may be formed on an upper surface of the molding layer 170. The upper redistribution layer 200*d* may include multi-layered copper wires for electrical connection with the copper foil of the ETS. The upper redistribution layer 200*d* may include second upper pads 222 and second conductive vias 228.

Chip pads 16 of a semiconductor chip 10 and the connection structures 162 may be connected to portions of the lower redistribution layer 100*c* while making direct contact with the portions of the lower redistribution layer 100*c*. For example, the chip pads 16 of the semiconductor chip 10 and the connection structures 162 may be connected to some of the first conductive vias 128 by direct contact therebetween.

Figure 6:
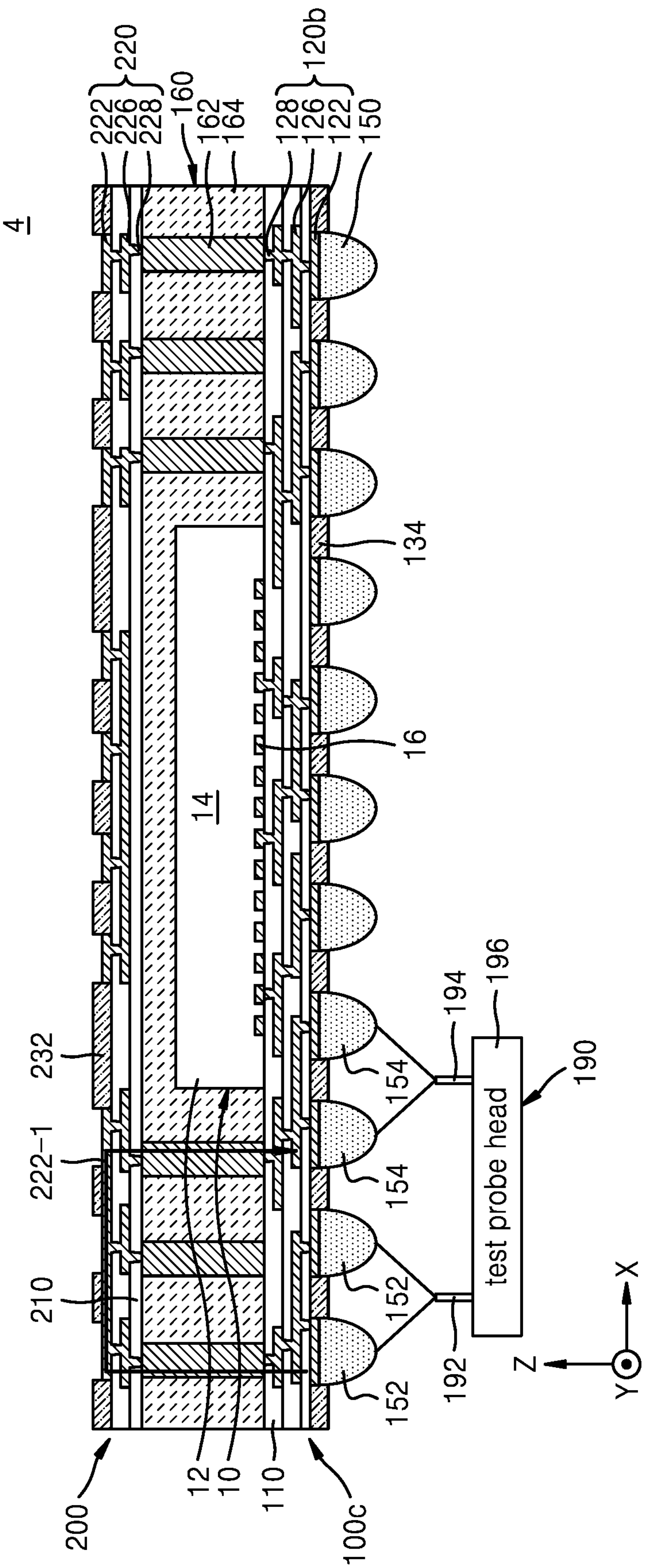
FIG. 6 is a cross-sectional view illustrating a semiconductor package according to one or more example embodiments.

FIG. 6 is a cross-sectional view illustrating a semiconductor package 4 according to one or more example embodiments.

Referring to FIG. 6, the semiconductor package 4 may include a lower redistribution layer 100*c*, connection structures 162, and an upper redistribution layer 200.

The lower redistribution layer 100*c* may include a plurality of first lower pads 122, a plurality of first redistribution line patterns 126, and a plurality of first conductive vias 128.

Chip pads 16 of a semiconductor chip 10 and the connection structures 162 may be connected to portions of the lower redistribution layer 100*c* while making direct contact with the portions of the lower redistribution layer 100*c*. For example, the chip pads 16 of the semiconductor chip 10 and the connection structures 162 may be connected to some of the first conductive vias 128 by direct contact therebetween.

FIGS. 7, 8, 9, 10 and 11 are cross-sectional views illustrating package-on-packages 1000, 1000*a*, 1000*b*, 1000*c*, and 1000*d* having semiconductor packages according to one or more example embodiments.

Figure 7:
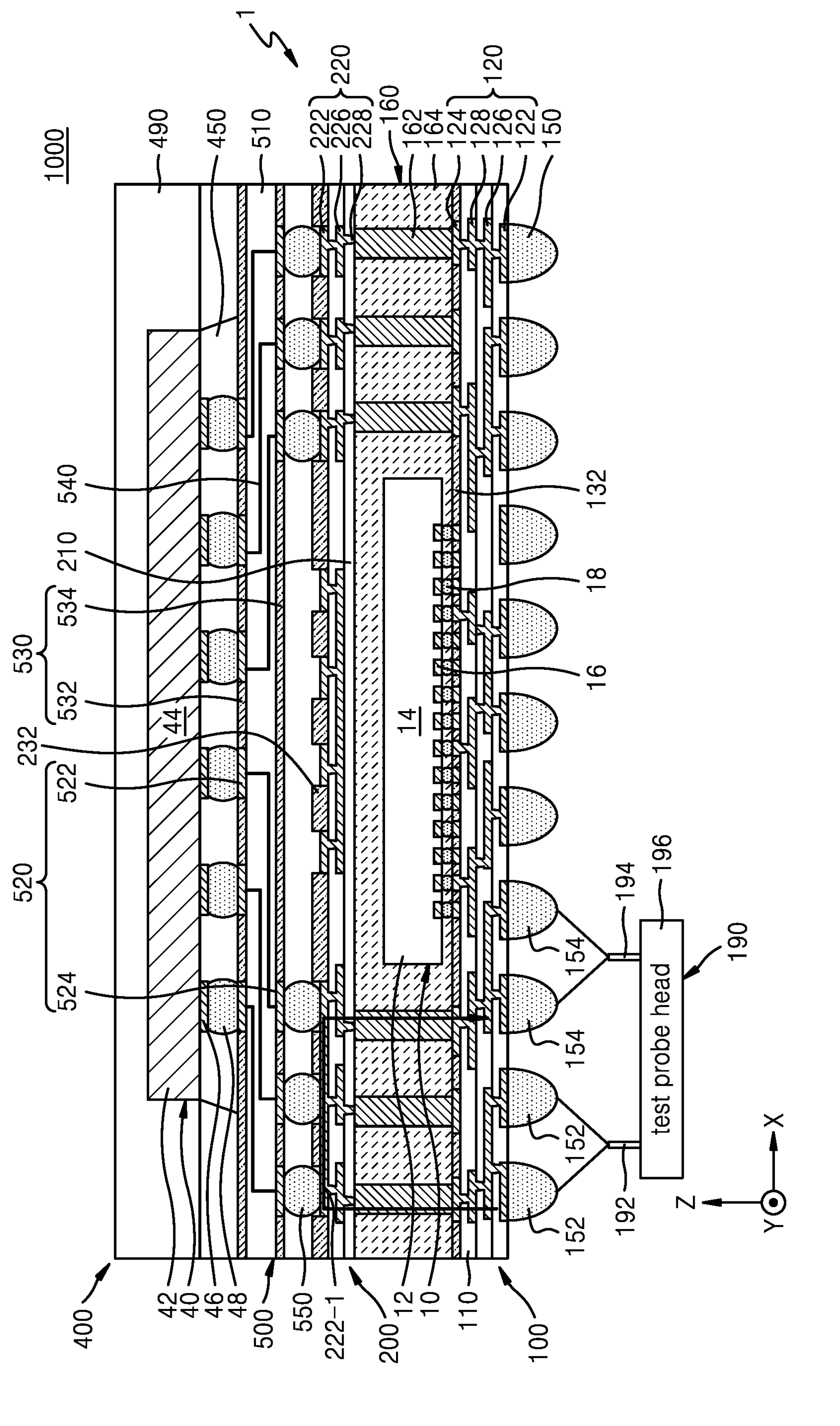
FIG. 7 is a cross-sectional view illustrating a package-on-package having semiconductor packages according to one or more example embodiments.

Referring to FIG. 7, the package-on-package 1000 includes a second semiconductor package 400 disposed on a first semiconductor package 1. The first semiconductor package 1 may be a lower semiconductor package, and the second semiconductor package 400 may be an upper semiconductor package. The first semiconductor package 1, a first semiconductor chip 10, a first semiconductor substrate 12, a first semiconductor device 14, first chip pads 16, and first chip connection terminals 18 described with reference to one or more example embodiments shown in FIG. 7 are substantially similar to the semiconductor package 1, the semiconductor chip 10, the semiconductor substrate 12, the semiconductor device 14, the chip pads 16, and the chip connection terminals 18 described with reference to one or more example embodiments shown in FIG. 1, and thus duplicative descriptions thereof are omitted.

The second semiconductor package 400 may include at least one second semiconductor chip 40. The second semiconductor package 400 may be electrically connected to the first semiconductor package 1 through a plurality of package connection terminals 550 attached to a plurality of second upper pads 222 of the first semiconductor package 1 that are exposed without being covered with a second upper solder resist layer 232. In addition, the package connection terminals 550 may be electrically connected to a first connection pad 222-1 by direct contact with the first connection pad 222-1.

The at least one second semiconductor chip 40 may include: a second semiconductor substrate 42 having a second semiconductor device 44 formed on an active surface of the second semiconductor substrate 42; and a plurality of second chip pads 46 provided on the active surface of the second semiconductor substrate 42. The second semiconductor substrate 42, the second semiconductor device 44, and the second chip pads 46 according to the one or more example embodiments shown in FIG. 7 are substantially similar to the semiconductor substrate 12, the semiconductor device 14, and the chip pads 16 described with reference to the one or more example embodiments shown in FIG. 1, and thus repeated descriptions thereof are omitted.

The at least one second semiconductor chip 40 may be a memory semiconductor chip. The at least one second semiconductor chip 40 may be, but is not limited to, for example, a DRAM chip, an SRAM chip, a flash memory chip, an EEPROM chip, a PRAM chip, an MRAM chip, or an RRAM chip.

Although FIG. 7 illustrates one or more example embodiments wherein the at least one second semiconductor chip 40 of the second semiconductor package 400 is mounted on a package base substrate 500 by a flip-chip method, this is a non-limiting example. The package-on-package 1000 may include any type of semiconductor package as an upper semiconductor package as long as the semiconductor package includes at least one second semiconductor chip 40 and the package connection terminals 550 are attachable to a lower side of the semiconductor package for electrical connection with the first semiconductor package 1.

The package base substrate 500 may include a base board layer 510 and a plurality of board pads 520 provided on upper and lower surfaces of the base board layer 510. The board pads 520 may include a plurality of upper board pads 522 provided on the upper surface of the base board layer 510 and a plurality of lower board pads 524 provided on the lower surface of the base board layer 510. In one or more example embodiments, the package base substrate 500 may be a printed circuit board. For example, the package base substrate 500 may be a multi-layer printed circuit board. The base board layer 510 may include, but is not limited to, at least one material selected from a phenol resin, an epoxy resin, and polyimide.

A board solder resist layer 530 comprising the board pads 520 may be formed on the upper and lower surfaces of the base board layer 510. The board solder resist layer 530 may include: an upper board solder resist layer 532 covering the upper surface of the base board layer 510 and comprising the upper board pads 522; and a lower board solder resist layer 534 covering the lower surface of the base board layer 510 and comprising the lower board pads 524.

The package base substrate 500 may include board wiring 540, which electrically connects the upper board pads 522 and the lower board pads 524 to each other. The board wiring 540 may include board wiring lines and board wiring vias. The board wiring 540 may include, but is not limited to, nickel, stainless steel, or beryllium copper. In one or more example embodiments, the board wiring 540 may be disposed between the upper surface of the base board layer 510 and the upper board solder resist layer 532, and/or between the lower surface of the base board layer 510 and the lower board solder resist layer 534.

The upper board pads 522 may be electrically connected to the second semiconductor chip 40. For example, a plurality of second chip connection terminals 48 may be provided between the second chip pads 46 of the second semiconductor chip 40 and the upper board pads 522 of the package base substrate 500 to electrically connect the second semiconductor chip 40 and the package base substrate 500 to each other. In one or more example embodiments, a second underfill layer 450 surrounding the second chip connection terminals 48 may be disposed between the second semiconductor chip 40 and the package base substrate 500. For example, the second underfill layer 450 may include, but is not limited to, an epoxy resin and may be formed by a capillary underfill method. In one or more example embodiments, the second underfill layer 450 may be a non-conductive film.

An upper molding layer 490, which surrounds the second semiconductor chip 40, may be disposed on the package base substrate 500. The upper molding layer 490 may include, but is not limited to, for example, an epoxy mold compound (EMC). In one or more example embodiments, the upper molding layer 490 may cover an inactive surface of the second semiconductor chip 40. In one or more other example embodiments, the upper molding layer 490 may cover a lateral surface of the second semiconductor chip 40 but may not cover the non-active surface of the second semiconductor chip 40, and a heat dissipation member may be attached to the non-active surface of the second semiconductor chip 40.

Figure 8:
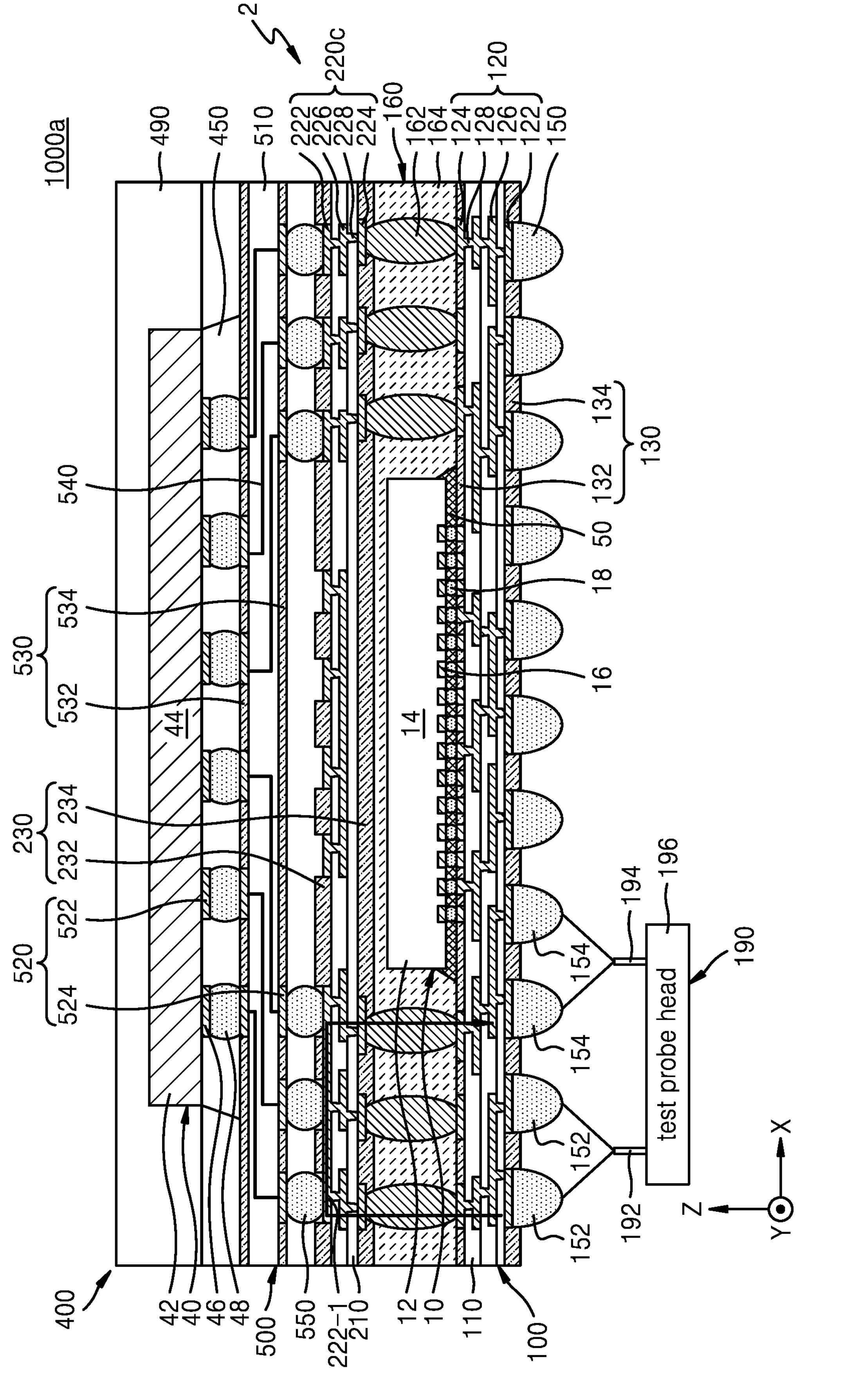
FIG. 8 is a cross-sectional view illustrating a package-on-package having semiconductor packages according to one or more example embodiments.

Referring to one or more example embodiments shown in FIG. 8, the package-on-package 1000*a* includes a second semiconductor package 400 disposed on a first semiconductor package 2. The first semiconductor package 2 may be a lower semiconductor package, and the second semiconductor package 400 may be an upper semiconductor package. The first semiconductor package 2 may be substantially similar to the semiconductor package 2 described with reference to one or more example embodiments shown in FIG. 4, and the second semiconductor package 400 may be substantially similar to the second semiconductor package 400 described with reference to one or more example embodiments shown in FIG. 7. Thus, duplicate descriptions thereof are omitted.

Figure 9:
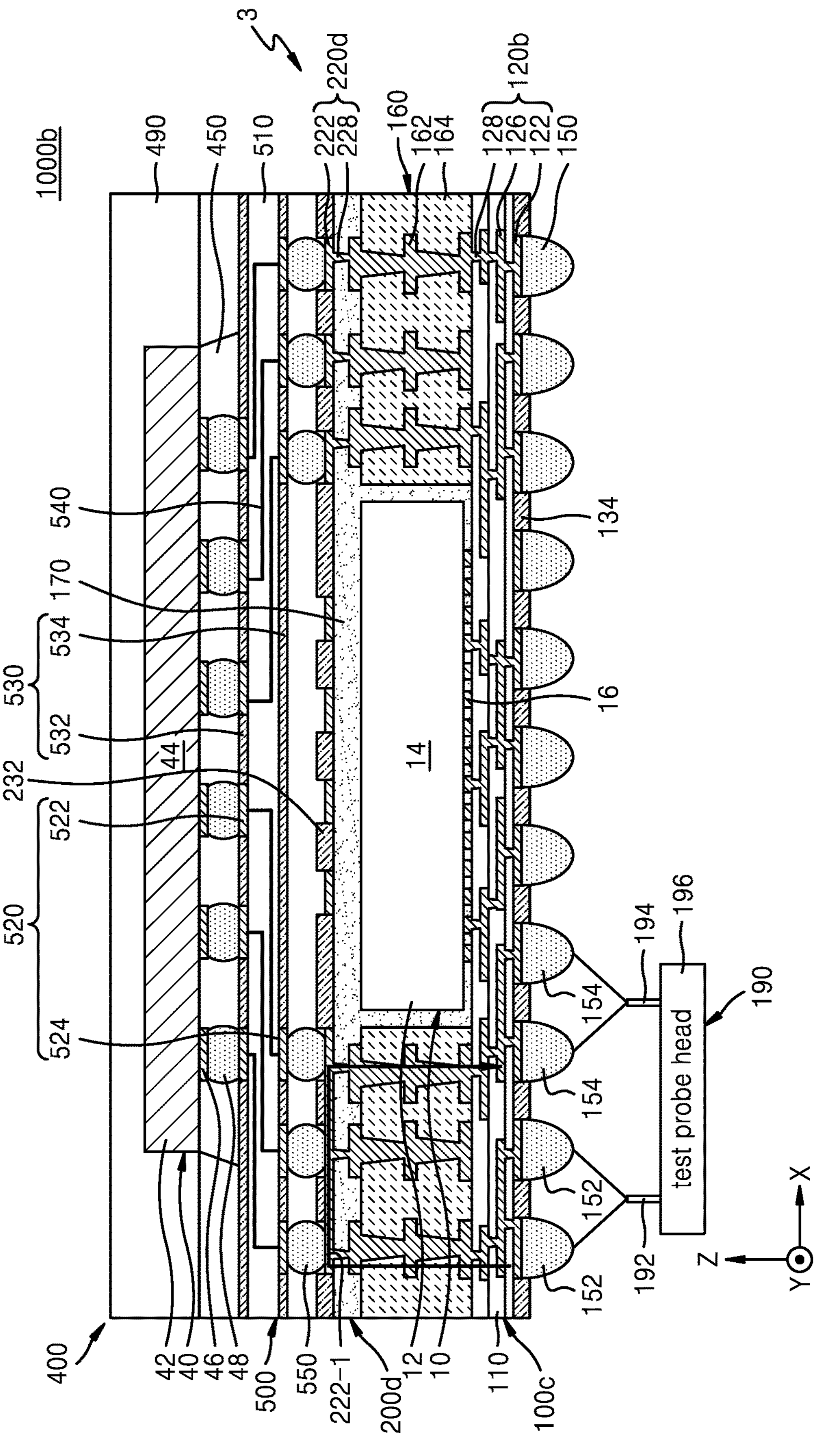
FIG. 9 is a cross-sectional view illustrating a package-on-package having semiconductor packages according to one or more example embodiments.

Referring to one or more example embodiments shown in FIG. 9, the package-on-package 1000*b* includes a second semiconductor package 400 disposed on a first semiconductor package 3. The first semiconductor package 3 may be a lower semiconductor package, and the second semiconductor package 400 may be an upper semiconductor package. The first semiconductor package 3 may be substantially similar to the semiconductor package 3 described with reference to one or more example embodiments shown in FIG. 5, and the second semiconductor package 400 may be substantially similar to the second semiconductor package 400 described with reference to one or more example embodiments shown in FIG. 7. Thus, duplicate descriptions thereof are omitted.

Figure 10:
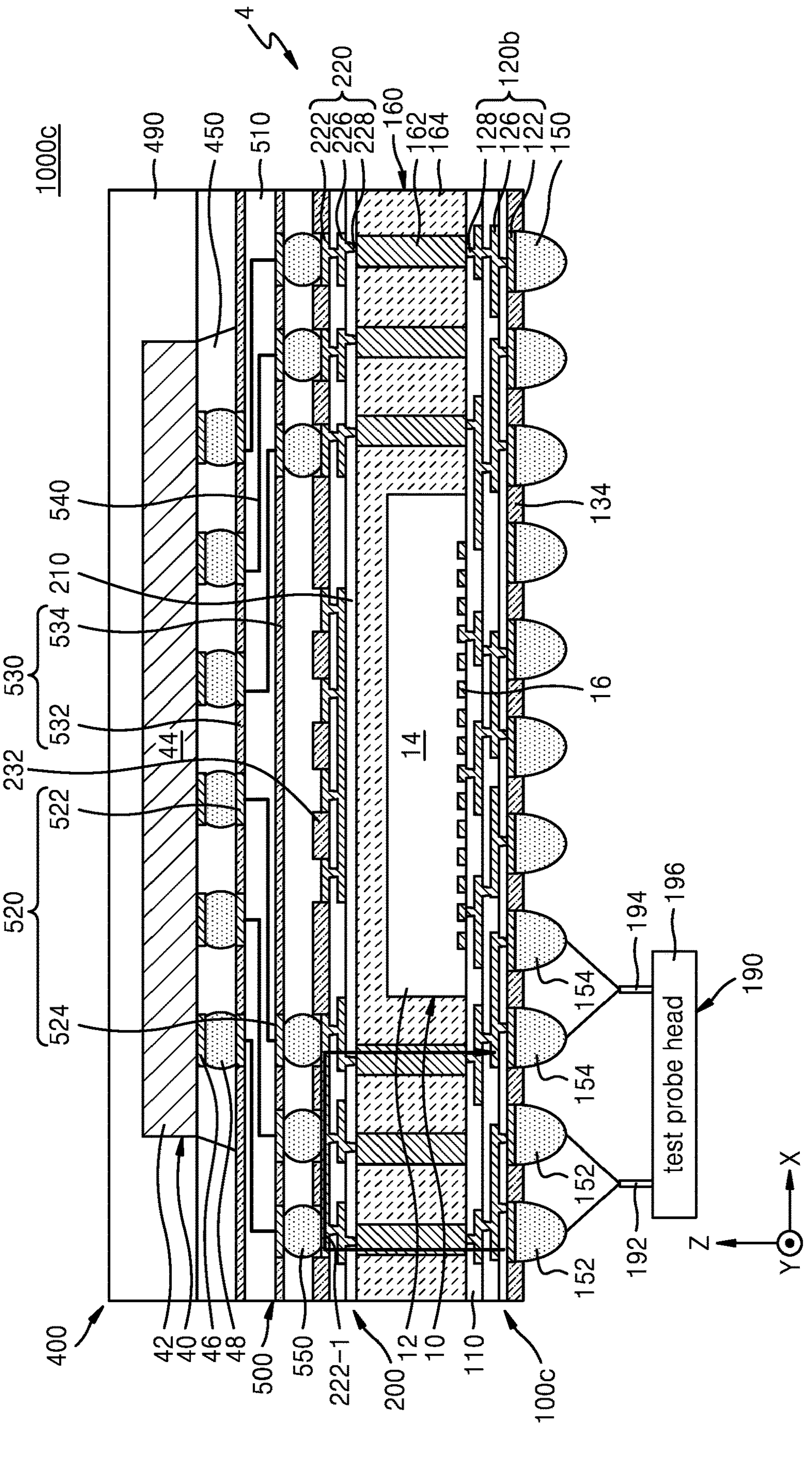
FIG. 10 is a cross-sectional view illustrating a package-on-package having semiconductor packages according to one or more example embodiments.

Referring to one or more example embodiments shown in FIG. 10, the package-on-package 1000*c* includes a second semiconductor package 400 disposed on a first semiconductor package 4. The first semiconductor package 4 may be a lower semiconductor package, and the second semiconductor package 400 may be an upper semiconductor package. The first semiconductor package 4 may be substantially similar to the semiconductor package 4 described with reference to one or more example embodiments shown in FIG. 6, and the second semiconductor package 400 may be substantially similar to the second semiconductor package 400 described with reference to one or more example embodiments shown in FIG. 7. Thus, duplicate descriptions thereof are omitted.

Figure 11:
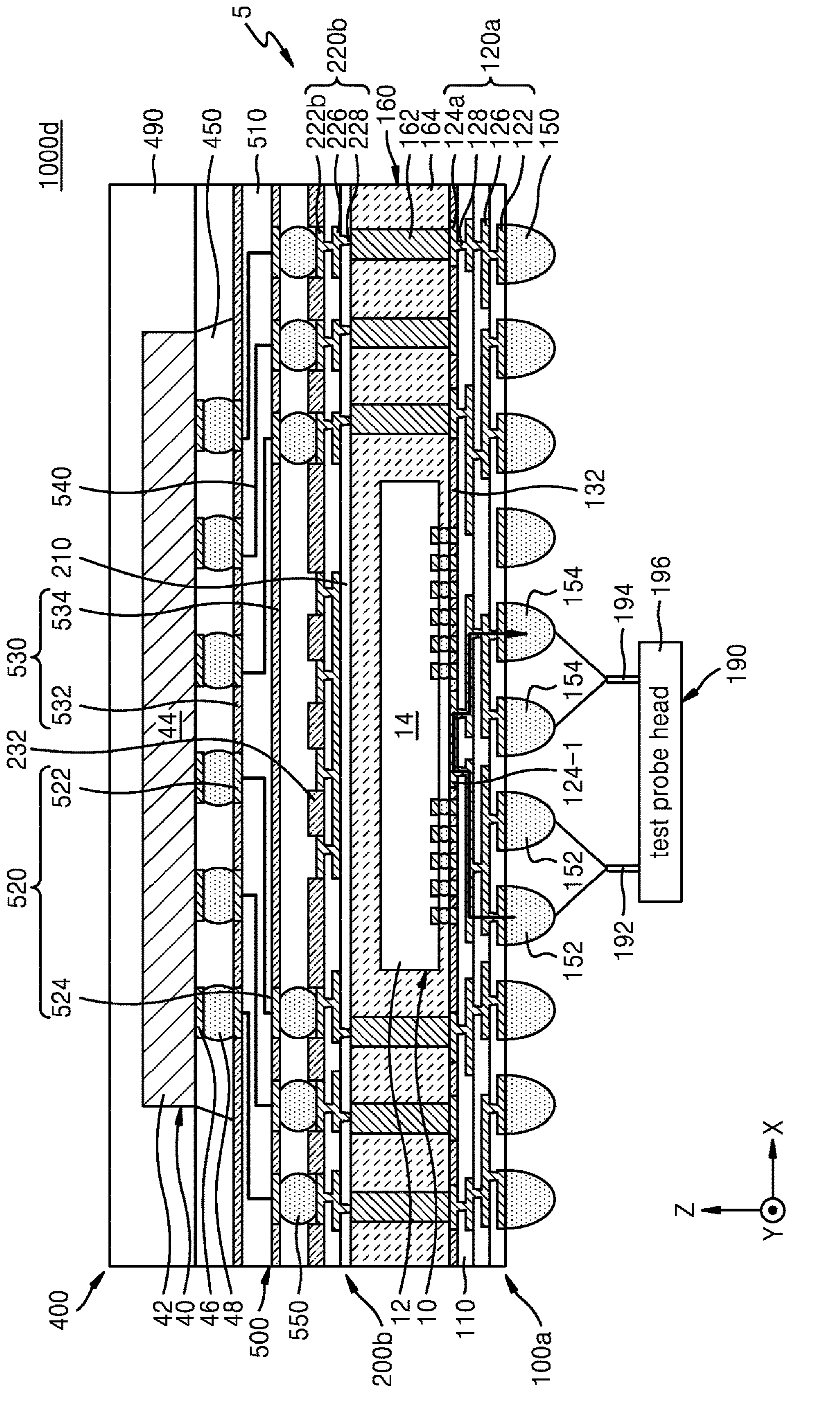
FIG. 11 is a cross-sectional view illustrating a package-on-package having semiconductor packages according to one or more example embodiments.

Referring to one or more example embodiments shown in FIG. 11, the package-on-package 1000*d* includes a second semiconductor package 400 disposed on a first semiconductor package 5. The first semiconductor package 5 may be a lower semiconductor package, and the second semiconductor package 400 may be an upper semiconductor package. The first semiconductor package 5 may be substantially similar to the semiconductor package 1*b* described with reference to one or more example embodiments shown in FIG. 2B, and the second semiconductor package 400 may be substantially similar to the second semiconductor package 400 described with reference to one or more example embodiments shown in FIG. 7. Thus, duplicate descriptions thereof are omitted. In addition, a plurality of package connection terminals 550 may be electrically connected to second upper pads 222*b* by direct contact therebetween.

While one or more example embodiments have been particularly shown and described, it will be understood that various changes in form and details may be made therein without departing from the spirit and scope of the following claims.

What is claimed is:

1. A semiconductor package comprising:

a first redistribution layer comprising:

a plurality of first conductive lines;

a plurality of first conductive vias, each of the plurality of first conductive vias being connected to at least one of the plurality of first conductive lines; and a plurality of first lower pads, each of the plurality of first lower pads being connected to one of the plurality of first conductive vias;

a semiconductor chip provided on the first redistribution layer;

connection structures provided on the first redistribution layer and spaced apart from the semiconductor chip in a horizontal direction;

a plurality of external connection terminals attached to the plurality of first lower pads;

a second redistribution layer provided on the connection structures, the second redistribution layer comprising:

a plurality of second conductive lines;

a plurality of second conductive vias, each of the plurality of second conductive vias being connected to at least one of the plurality of second conductive lines; and a plurality of second upper pads; and a plurality of electrical paths configured for testing the plurality of first conductive lines and the plurality of first conductive vias, each of the plurality of electrical paths comprising at least one of the plurality of first conductive lines and at least one of the plurality of first conductive vias, wherein each of the plurality of electrical paths is connected to at least four external connection test terminals from among the plurality of external connection terminals, and wherein a first electrical path among the plurality of electrical paths passes through one of the plurality of second upper pads, the one of the plurality of second upper pads electrically connecting at least two of the connection structures to form a common connection region in the electrical test path.

2. The semiconductor package of claim 1, wherein the at least four external connection test terminals comprise:

at least two first test terminals configured to input a test input signal; and at least two second test terminals configured to output a test output signal.

3. The semiconductor package of claim 2, wherein the at least two first test terminals are electrically connected to each other through one of the plurality of first conductive lines, and wherein the at least two second test terminals are electrically connected to each other through another one of the plurality of first conductive lines.

4. The semiconductor package of claim 1, wherein each of the at least four external connection test terminals is a dummy external connection terminal.

5. The semiconductor package of claim 1, wherein the at least four external connection test terminals are provided in a plurality of first areas, and wherein each of the plurality of first areas is adjacent to one of a plurality of vertices of the first redistribution layer.

6. The semiconductor package of claim 1, further comprising:

a filler structure surrounding the connection structures and the semiconductor chip, wherein the connection structures penetrate the filler structure to electrically connect the first redistribution layer to the second redistribution layer, and wherein the filler structure extends between the semiconductor chip and the first redistribution layer, and between the semiconductor chip and the second redistribution layer.

7. A semiconductor package comprising:

a first redistribution layer comprising:

a plurality of first conductive lines;

a plurality of first conductive vias, each of the plurality of first conductive vias being connected to at least one of the plurality of first conductive lines; and a plurality of first lower pads, each of the plurality of first lower pads being connected to one of the plurality of first conductive vias;

a semiconductor chip provided on the first redistribution layer;

connection structures provided on the first redistribution layer and spaced apart from the semiconductor chip in a horizontal direction;

a plurality of external connection terminals attached to the plurality of first lower pads;

a second redistribution layer provided on the connection structures, the second redistribution layer comprising:

a plurality of second conductive lines;

a plurality of second conductive vias, each of the plurality of second conductive vias being connected to at least one of the plurality of second conductive lines;

a plurality of second lower pads, each of the plurality of second lower pads being connected to one of the plurality of second conductive vias, a plurality of second upper pads; and a plurality of electrical paths configured for testing (i) the plurality of first lower pads, the plurality of first conductive lines, and the plurality of first conductive vias, or (ii) the plurality of second lower pads, the plurality of second conductive lines, and the plurality of second conductive vias, wherein a first electrical path among the plurality of electrical paths passes through one of the plurality of second upper pads, the one of the plurality of second upper pads electrically connecting at least two of the connection structures to form a common connection region in the electrical test path, wherein each of the plurality of electrical paths comprises at least one of the plurality of first conductive lines and at least one of the plurality of first conductive vias, wherein each of the plurality of electrical paths is connected to at least four external connection test terminals from among the plurality of external connection terminals, and wherein the at least four external connection test terminals comprise:

at least two first test terminals configured to input a test input signal; and at least two second test terminals configured to output a test output signal.

8. The semiconductor package of claim 7, wherein the plurality of electrical paths are not electrically connected to external connection terminals other than the at least four external connection test terminals.

9. The semiconductor package of claim 7, wherein the semiconductor package is the configured to output the test input signal to the at least two second test terminals through:

the plurality of first lower pads, the plurality of first conductive lines, and the plurality of first conductive vias;

the connection structures; and at least one of the plurality of second upper pads, the plurality of second conductive lines, and the plurality of second conductive vias.

10. The semiconductor package of claim 7, wherein the semiconductor package is the configured to output the test input signal to the at least two second test terminals through the plurality of first lower pads, the plurality of first conductive lines, and the plurality of first conductive vias.

11. The semiconductor package of claim 7, wherein the at least four external connection test terminals are provided in a plurality of first areas that are respectively adjacent to a plurality of vertices of the first redistribution layer.

12. The semiconductor package of claim 11, wherein the at least two first test terminals and the at least two second test terminals, which are electrically connected to each other, are provided in one of the plurality of first areas.

13. A package-on-package comprising:

a first semiconductor package; and a second semiconductor package, wherein the first semiconductor package comprises:

a first redistribution layer comprising:

a plurality of first conductive lines;

a plurality of first conductive vias, each of the plurality of first conductive vias being connected to at least one of the plurality of first conductive lines; and a plurality of first lower pads, each of the plurality of first lower pads being connected to one of the plurality of first conductive vias;

a first semiconductor chip provided on the first redistribution layer and comprising chip pads;

connection structures provided on the first redistribution layer and spaced apart from the first semiconductor chip in a horizontal direction;

a plurality of external connection terminals attached to the plurality of first lower pads;

a second redistribution layer provided on the connection structures, the second redistribution layer comprising:

a plurality of second conductive lines;

a plurality of second conductive vias, each of the plurality of second conductive vias being connected to at least one of the plurality of second conductive lines;

a plurality of second lower pads, each of the plurality of second lower pads being connected to one of the plurality of second conductive vias, and a plurality of second upper pads, wherein the second semiconductor package is provided on the first semiconductor package, wherein the second semiconductor package comprises:

a second semiconductor chip; and package connection terminals configured to electrically connect the second semiconductor chip to the second redistribution layer;

wherein the package-on-package further comprises a plurality of electrical paths configured for testing (i) the plurality of first lower pads, the plurality of first conductive lines, and the plurality of first conductive vias, or (ii) the plurality of second lower pads, the plurality of second conductive lines, and the plurality of second conductive vias, wherein a first electrical path among the plurality of electrical paths passes through one of the plurality of second upper pads, the one of the plurality of second upper pads electrically connecting at least two of the connection structures to form a common connection region in the electrical test path, wherein each of the plurality of electrical paths comprises at least one of the plurality of first conductive lines; and at least one of the plurality of first conductive vias, wherein each of the plurality of electrical paths is connected to at least four external connection test terminals from among the plurality of external connection terminals, wherein the at least four external connection test terminals comprise:

at least two first test terminals configured to input a test input signal; and at least two second test terminals configured to output a test output signal, wherein the at least four external connection test terminals are provided in a plurality of first areas that are respectively adjacent to a plurality of vertices of the first redistribution layer, wherein the at least two first test terminals are electrically connected to each other through a lowermost conductive line of the plurality of first conductive lines, and wherein the at least two second test terminals are electrically connected to each other through a another lowermost conductive line of the plurality of first conductive lines.

14. The package-on-package of claim 13, wherein the at least two first test terminals and the at least two second test terminals are provided in the plurality of first areas, and the test input signal is output to the at least two second test terminals through:

the plurality of first lower pads;

the plurality of first conductive lines;

the plurality of first conductive vias;

the connection structures;

the plurality of second conductive lines;

the plurality of second conductive vias; and the plurality of second upper pads.

15. The package-on-package of claim 14, wherein the plurality of second upper pads to which the test input signal is input are electrically connected to the connection structures and in direct contact with the package connection terminals.

16. The package-on-package of claim 13, wherein only one of an ampere meter and a voltmeter is electrically connected to the at least two first test terminals, and wherein only one of the ampere meter and the voltmeter is electrically connected to the at least two second test terminals.

17. The package-on-package of claim 13, wherein the connection structures comprise one of:

a through-mold via (TMV);

a conductive solder;

a conductive pillar; and a conductive bump.

* * * * *